(12) United States Patent
Chen et al.

(10) Patent No.: US 11,159,616 B2
(45) Date of Patent: Oct. 26, 2021

(54) EMAIL SYNCHRONIZATION METHOD AND APPARATUS, AND COMPUTER READABLE STORAGE MEDIUM

(71) Applicant: LUNKR TECHNOLOGY (GUANGZHOU) CO., LTD., Guangdong (CN)

(72) Inventors: Yingtang Chen, Guangdong (CN); Zhendong Tan, Guangdong (CN)

(73) Assignee: LUNKR TECHNOLOGY (GUANGZHOU) CO., LTD., Guangzhou (CN)

( * ) Notice: Subject to any disclaimer, the term of this patent is extended or adjusted under 35 U.S.C. 154(b) by 0 days.

(21) Appl. No.: 16/969,557

(22) PCT Filed: Jan. 3, 2019

(86) PCT No.: PCT/CN2019/070305
§ 371 (c)(1),
(2) Date: Aug. 12, 2020

(87) PCT Pub. No.: WO2019/157881
PCT Pub. Date: Aug. 22, 2019

(65) Prior Publication Data
US 2021/0006619 A1 Jan. 7, 2021

(30) Foreign Application Priority Data
Feb. 13, 2018 (CN) .......................... 201810147966.6

(51) Int. Cl.
*G06F 15/16* (2006.01)
*H04L 29/08* (2006.01)
(Continued)

(52) U.S. Cl.
CPC ........ *H04L 67/1095* (2013.01); *H03M 13/09* (2013.01); *H04L 51/22* (2013.01); *H04L 51/30* (2013.01)

(58) Field of Classification Search
CPC ..... H04L 67/1095; H04L 51/22; H04L 51/30; H03M 13/09
(Continued)

(56) References Cited

U.S. PATENT DOCUMENTS 7,788,352 B2 * 8/2010 Breuer .................. G06F 16/252
709/221
8,024,290 B2 * 9/2011 Yang ..................... G06F 16/275
707/625
(Continued)

FOREIGN PATENT DOCUMENTS

| CN | 101106537 A | 1/2008 |
|---|---|---|
| CN | 102291453 A | 12/2011 |

OTHER PUBLICATIONS

International Search Report of PCT Patent Application No. PCT/CN2019/070305 dated Mar. 27, 2019.

*Primary Examiner* — Alicia Baturay

(57) ABSTRACT

The present invention provides an email synchronization method and apparatus, and a computer readable storage medium. The method includes: separately obtaining index data of emails of a host node system and a mirror node system within a specified time range, and separately generating a first email index list and a second email index list; separately generating check values of the emails of the host node system and the mirror node system within the specified time range according to the first email index list and the second email index list; comparing the generated check values of the host node system with the generated check values of the mirror node system; and synchronizing email data of the host node system and the mirror node system
(Continued)

within the specified time range when the generated check values of the host node system are inconsistent with the generated check values of the mirror node system.

19 Claims, 2 Drawing Sheets

(51) Int. Cl.
    *H03M 13/09*     (2006.01)
    *H04L 12/58*     (2006.01)

(58) Field of Classification Search
    USPC ............................................................ 709/206
    See application file for complete search history.

(56) References Cited

U.S. PATENT DOCUMENTS

| | | | | |
|---|---|---|---|---|
| 8,112,549 | B2* | 2/2012 | Srinivasan | G06Q 10/107 |
| | | | | 709/248 |
| 8,635,266 | B2* | 1/2014 | Kang | H04L 67/1095 |
| | | | | 709/203 |
| 8,825,815 | B2* | 9/2014 | Gidron | H04L 67/34 |
| | | | | 709/221 |
| 9,524,327 | B2* | 12/2016 | Kang | H04L 67/1095 |
| 2005/0203905 | A1* | 9/2005 | Jung | G06F 16/27 |
| 2007/0014243 | A1* | 1/2007 | Meyer | H04L 67/125 |
| | | | | 370/249 |
| 2007/0016632 | A1* | 1/2007 | Schulz | G06F 16/275 |
| 2008/0270629 | A1* | 10/2008 | Yang | H04L 67/1095 |
| | | | | 709/248 |
| 2011/0167041 | A1* | 7/2011 | Fu | H04L 41/00 |
| | | | | 707/634 |
| 2021/0067475 | A1* | 3/2021 | Chen | H04L 12/1818 |
| 2021/0067570 | A1* | 3/2021 | Chen | H04L 51/22 |

* cited by examiner

EMAIL SYNCHRONIZATION METHOD AND APPARATUS, AND COMPUTER READABLE STORAGE MEDIUM

TECHNICAL FIELD

The present invention relates to the field of email service technologies, and in particular, to an email synchronization method and apparatus, and a computer readable storage medium.

BACKGROUND

Email is an important part of communication in people's daily life. Email is not merely a simple message, but has become an indispensable communication tool like mobile phones. With low costs, simplicity, ease of use, and global compatibility, email is used as a standard for message transmission.

To ensure high usability and stability of an email server and reduce loss caused by inaccessibility of an email system due to a computer hardware failure, a network reason, or other reasons, some email system servers adopt a hot backup solution, where two email systems are deployed: a host email system and a mirror system. The mirror system synchronizes a site structure, users, emails and other data of the host email system in real time or regularly. The host email system and the mirror system maintain the same topological structure, site structure and enterprise organization. The current email synchronization method is as follows: the mirror system evenly segments a file into a plurality of blocks (for example, 512-byte blocks); the host email system calculates two types of checksums for each segmented data block: a 32-bit rolling weak checksum, and a 128-bit Message Digest 5 (MD5) strong checksum; the mirror system transmits a checksum list of fileDst to a synchronous source; the synchronous source searches all 512-byte data blocks of a file fileSrc to find a data block that has the same weak checksum and strong checksum as a certain block of the file; the synchronous source finds out data in two adjacent matches of fileSrc, and transmits the data to the mirror system for synchronization. However, such an email synchronization method has the following disadvantages: It takes a relatively long time when the synchronous source synchronizes a large number of files. Moreover, the synchronous source generally uses a file or a directory as a unit during data comparison and synchronization. If data of an email system needs to be synchronized, full comparison and incremental synchronization may be performed by using the data of the entire email system. The email system has a large data volume and a large number of files, which further increases the time spent on comparison and synchronization. The synchronous source cannot perform separate synchronization within a small range based on a user and a time range, and cannot synchronize email data of a specified user quickly. The synchronous source can only implement one-way synchronization to the mirror system.

SUMMARY

An objective of the present invention is to provide an email synchronization method and apparatus, and a computer readable storage medium, which can effectively reduce an email comparison time, implement email data synchronization within a small range, improve synchronization efficiency of email data, and also achieve two-way synchronization between a host node system and a mirror node system.

To achieve the above purpose, the embodiments of the present invention provide an email synchronization method, including:

separately obtaining index data of emails of a host node system and a mirror node system within a specified time range, where the index data includes email identifiers, flag bits, folders, and receiving times;

generating a first email index list according to the index data of the emails of the host node system within the specified time range;

generating a second email index list according to the index data of the emails of the mirror node system within the specified time range;

generating check values of the emails of the host node system within the specified time range according to the first email index list;

generating check values of the emails of the mirror node system within the specified time range according to the second email index list;

comparing the generated check values of the host node system with the generated check values of the mirror node system; and synchronizing email data of the host node system and the mirror node system within the specified time range when the generated check values of the host node system are inconsistent with the generated check values of the mirror node system.

Preferably, the synchronizing email data of the host node system and the mirror node system within the specified time range when the generated check values of the host node system are inconsistent with the generated check values of the mirror node system specifically includes:

comparing email identifiers and flag bits in the first email index list with corresponding email identifiers and flag bits in the second email index list when the generated check values of the host node system are inconsistent with the generated check values of the mirror node system, to obtain a list of property changes of partial indexes, a list of new email identifiers of the host node system, a list of deleted email identifiers of the host node system, and a list of new email identifiers of the mirror node system;

synchronizing the email data of the host node system within the specified time range to the mirror node system according to the list of the property changes of the partial indexes, the list of the new email identifiers of the host node system, and the list of the deleted email identifiers of the host node system; and synchronizing the email data of the mirror node system within the specified time range to the host node system according to the list of the new email identifiers of the mirror node system.

Preferably, the synchronizing the email data of the host node system within the specified time range to the mirror node system according to the list of the property changes of the partial indexes, the list of the new email identifiers of the host node system, and the list of the deleted email identifiers of the host node system specifically includes:

updating change content of the host node system within the specified time range to the mirror node system according to the list of the property changes of the partial indexes;

obtaining, according to the list of the new email identifiers of the host node system, a list of new emails marked as being in a non-deferred deletion state of the host node system within the specified time range, and synchronizing email data in the host node system corresponding to the list of the new emails to the mirror node system; and obtaining, according to the list of the deleted email identifiers of the host node system, a list of deleted emails marked as being in a deferred deletion state of the host node system within the specified time range, and deleting email data in the mirror node system corresponding to the list of the deleted emails.

Preferably, the synchronizing the email data of the mirror node system within the specified time range to the host node system according to the list of the new email identifiers of the mirror node system specifically includes:

obtaining, according to the list of the new email identifiers of the mirror node system, a list of system emails generated by the mirror node system, and synchronizing email data in the mirror node system corresponding to the list of system emails to the host node system.

Preferably, the generating check values of the emails of the host node system within the specified time range according to the first email index list specifically includes:

generating, according to an email identifier, a flag bit and a folder corresponding to any email in the first email index list, a character string corresponding to the any email;

generating a 32-bit Cyclic Redundancy Check (CRC) value according to the character string corresponding to the any email by using a CRC check tool;

generating an initial check value corresponding to the any email according to the receiving time corresponding to the any email in the first email index list;

performing exclusive or processing on the CRC value and the initial check value corresponding to the any email, to obtain a current check value corresponding to the any email, and updating the current check value corresponding to the any email into a preset first mapping table; and calculating current check values corresponding to the emails within the specified time range according to a current date, and updating the current check values corresponding to the emails within the specified time range into the preset first mapping table.

Preferably, the generating an initial check value corresponding to the any email according to the receiving time corresponding to the any email in the first email index list specifically includes:

when the receiving time corresponding to the any email is earlier than a preset year, generating the initial check value corresponding to the any email according to a particular year of the receiving time corresponding to the any email;

when the receiving time corresponding to the any email is a current day, generating the initial check value corresponding to the any email according to the year, month and day of the receiving time corresponding to the any email;

when the receiving time corresponding to the any email is a current month, calculating the initial check value corresponding to the any email according to $P_1=Y-N+M+D-1$, where Y, M and D are the year, month and day of the receiving time corresponding to the any email respectively, and N is the preset year;

when the receiving time corresponding to the any email is a current year, calculating the initial check value corresponding to the any email according to $P_2=Y-N+M-1$, where Y and M are the year and month of the receiving time corresponding to the any email respectively, and N is the preset year; and when the receiving time corresponding to the any email is later than the preset year, calculating the initial check value corresponding to the any email according to $P_3=Y-N$, where Y is the year of the receiving time corresponding to the any email, and N is the preset year.

Preferably, the calculating current check values corresponding to the emails within the specified time range according to a current date, and updating the current check values corresponding to the emails within the specified time range into the preset first mapping table specifically includes:

calculating, according to a particular year corresponding to the current date and the preset year, a current check value corresponding to each year from the preset year to the year corresponding to the current date;

calculating, according to the year and month corresponding to the current date and the preset year, a current check value corresponding to each month from the first month of the year corresponding to the current date to the month corresponding to the current date;

calculating, according to the year, month and day corresponding to the current date and the preset year, a current check value corresponding to each day from the first day of the month corresponding to the current date to the day corresponding to the current date; and updating the current check value corresponding to each year, the current check value corresponding to each month, and the current check value corresponding to each day into the preset first mapping table.

The embodiments of the present invention further provide an email synchronization apparatus, including:

an index data obtaining module, configured to separately obtain index data of emails of a host node system and a mirror node system within a specified time range, where the index data includes email identifiers, flag bits, folders, and receiving times;

a first index list generating module, configured to generate a first email index list according to the index data of the emails of the host node system within the specified time range;

a second index list generating module, configured to generate a second email index list according to the index data of the emails of the mirror node system within the specified time range;

a first check value generating module, configured to generate check values of the emails of the host node system within the specified time range according to the first email index list;

a second check value generating module, configured to generate check values of the emails of the mirror node system within the specified time range according to the second email index list;

a check value comparison module, configured to compare the generated check values of the host node system with the generated check values of the mirror node system; and an email synchronization module, configured to synchronize email data of the host node system and the mirror node system within the specified time range when the generated check values of the host node system are inconsistent with the generated check values of the mirror node system.

The embodiments of the present invention further provide an email synchronization apparatus, including a processor, a memory, and a computer program that is stored in the memory and configured to be executed by the processor, where when executing the computer program, the processor implements the above email synchronization method.

The embodiments of the present invention further provide a computer readable storage medium, where the computer readable storage medium includes a stored computer program, and when being run, the computer program controls a device where the computer readable storage medium is located to perform the above email synchronization method.

Compared with the prior art, an email synchronization method provided in the embodiments of the present invention achieves the following beneficial effects: The email synchronization method includes: separately obtaining index data of emails of a host node system and a mirror node system within a specified time range, where the index data includes email identifiers, flag bits, folders, and receiving times; generating a first email index list according to the index data of the emails of the host node system within the specified time range; generating a second email index list according to the index data of the emails of the mirror node system within the specified time range; generating check values of the emails of the host node system within the specified time range according to the first email index list; generating check values of the emails of the mirror node system within the specified time range according to the second email index list; comparing the generated check values of the host node system with the generated check values of the mirror node system; and synchronizing email data of the host node system and the mirror node system within the specified time range when the generated check values of the host node system are inconsistent with the generated check values of the mirror node system. This method can effectively reduce an email comparison time, implement email data synchronization within a small range, improve synchronization efficiency of email data, and also achieve two-way synchronization between the host node system and the mirror node system. The embodiments of the present invention further provide an email synchronization apparatus and a computer readable storage medium.

DESCRIPTION OF EMBODIMENTS

The following clearly and completely describes the technical solutions in the embodiments of the present invention with reference to accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
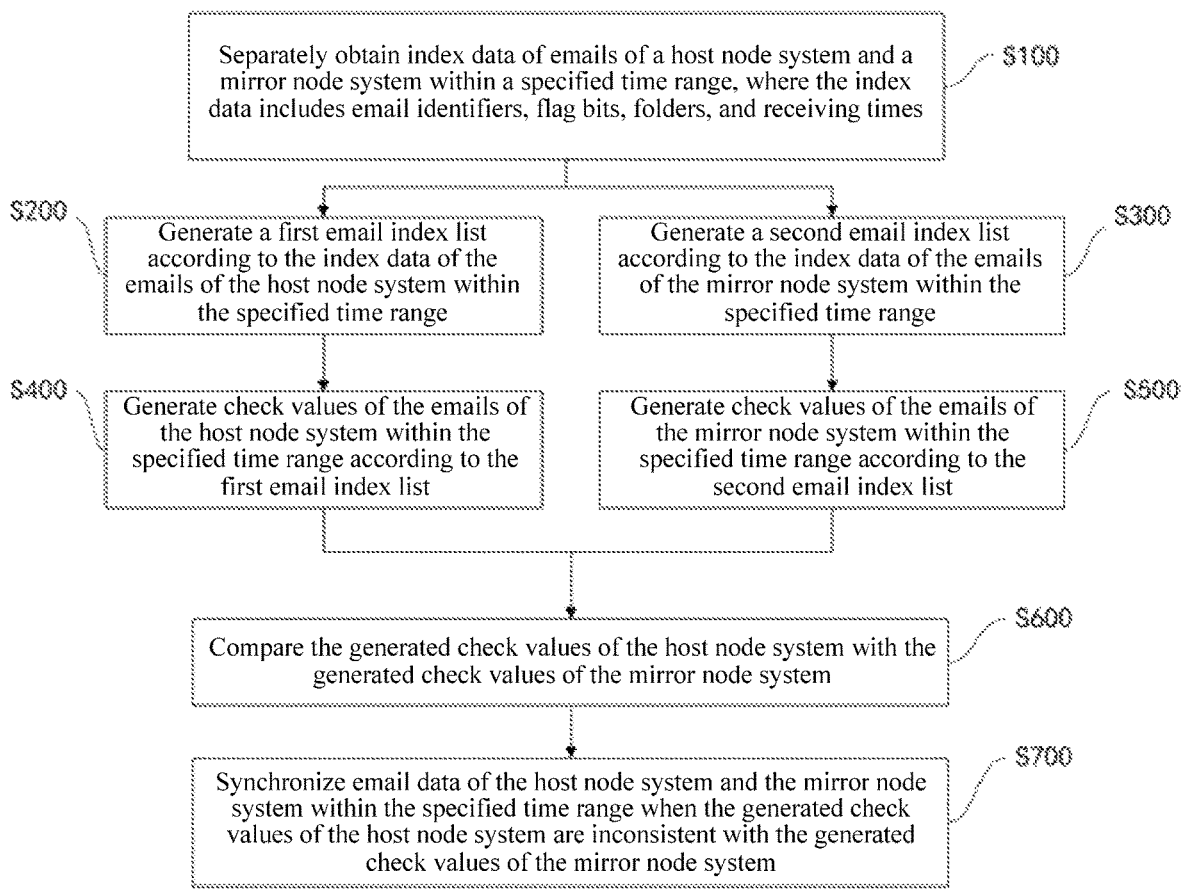
FIG. 1 is a flowchart of an email synchronization method according to an embodiment of the present invention.

Referring to FIG. 1, FIG. 1 is a flowchart of an email synchronization method according to an embodiment of the present invention. The email synchronization method includes the following steps:

S100: separately obtain index data of emails of a host node system and a mirror node system within a specified time range, where the index data includes email identifiers, flag bits, folders, and receiving times.

S200: generate a first email index list according to the index data of the emails of the host node system within the specified time range.

S300: generate a second email index list according to the index data of the emails of the mirror node system within the specified time range.

S400: generate check values of the emails of the host node system within the specified time range according to the first email index list.

S500: generate check values of the emails of the mirror node system within the specified time range according to the second email index list.

S600: compare the generated check values of the host node system with the generated check values of the mirror node system.

S700: synchronize email data of the host node system and the mirror node system within the specified time range when the generated check values of the host node system are inconsistent with the generated check values of the mirror node system.

Through the method, the check values are directly generated according to the index data. The check values are only related to the quantity of emails, but have nothing to do with the email size, so that the check values can be generated and compared quickly. In addition, it is unnecessary to check email content during comparison, which reduces the comparison time, thereby effectively reducing the time spent on email comparison, improving the synchronization efficiency of email data, and achieving two-way synchronization between the host node system and the mirror node system.

The index data further includes index modification times, senders, recipients, subjects, header Message-IDs, and the like. When the specified time range is null, index data of all emails of the host node system and the mirror node system is obtained separately, and the index data is sorted according to the index modification times. Specifically, the first email index list is generated according to the email identifiers, flag bits, folders and receiving times in the index data of the emails of the host node system within the specified time range; and the second email index list is generated according to the email identifiers, flag bits, folders and receiving times in the index data of the emails of the mirror node system within the specified time range. A method for calculating the check values of the host node system within the specified time range is the same as a method for calculating the check values of the mirror node system within the specified time range. Therefore, calculation of the check values of the host node system within the specified time range is taken as an example for description.

In an optional embodiment, S700 of synchronizing email data of the host node system and the mirror node system within the specified time range when the generated check values of the host node system are inconsistent with the generated check values of the mirror node system specifically includes:

comparing email identifiers and flag bits in the first email index list with corresponding email identifiers and flag bits in the second email index list when the generated check values of the host node system are inconsistent with the generated check values of the mirror node system, to obtain a list of property changes of partial indexes, a list of new email identifiers of the host node system, a list of deleted email identifiers of the host node system, and a list of new email identifiers of the mirror node system;

synchronizing the email data of the host node system within the specified time range to the mirror node system according to the list of the property changes of the partial indexes, the list of the new email identifiers of the host node system, and the list of the deleted email identifiers of the host node system; and synchronizing the email data of the mirror node system within the specified time range to the host node system according to the list of the new email identifiers of the mirror node system.

In an optional embodiment, the synchronizing the email data of the host node system within the specified time range to the mirror node system according to the list of the property changes of the partial indexes, the list of the new email identifiers of the host node system, and the list of the deleted email identifiers of the host node system specifically includes:

updating change content of the host node system within the specified time range to the mirror node system according to the list of the property changes of the partial indexes;

obtaining, according to the list of the new email identifiers of the host node system, a list of new emails marked as being in a non-deferred deletion state of the host node system within the specified time range, and synchronizing email data in the host node system corresponding to the list of the new emails to the mirror node system; and obtaining, according to the list of the deleted email identifiers of the host node system, a list of deleted emails marked as being in a deferred deletion state of the host node system within the specified time range, and deleting email data in the mirror node system corresponding to the list of the deleted emails.

In this embodiment, when a user deletes an email, the email deleted by the user is marked as being in a deferred deletion state in the host node system. In this case, it seems to the user that the email has been deleted, while the email is actually deleted later in the background, thus providing a data basis for two-way synchronization between the host node system and the mirror node system.

In an optional embodiment, the synchronizing the email data of the mirror node system within the specified time range to the host node system according to the list of the new email identifiers of the mirror node system specifically includes:

obtaining, according to the list of the new email identifiers of the mirror node system, a list of system emails generated by the mirror node system, and synchronizing email data in the mirror node system corresponding to the list system emails to the host node system.

In an optional embodiment, the generating check values of the emails of the host node system within the specified time range according to the first email index list specifically includes:

generating, according to an email identifier, a flag bit and a folder corresponding to any email in the first email index list, a character string corresponding to the any email;

generating a 32-bit Cyclic Redundancy Check (CRC) value according to the character string corresponding to the any email by using a CRC check tool;

generating an initial check value corresponding to the any email according to the receiving time corresponding to the any email in the first email index list;

performing exclusive or processing on the CRC value and the initial check value corresponding to the any email, to obtain a current check value corresponding to the any email, and updating the current check value corresponding to the any email into a preset first mapping table; and calculating current check values corresponding to the emails within the specified time range according to a current date, and updating the current check values corresponding to the emails within the specified time range into the preset first mapping table.

In this implementation, the check values of the mirror node system within the specified time range are calculated by using the same method as calculating the check values of the host node system within the specified time range, and the check values of the mirror node system within the specified time range are updated into a preset second mapping table. The preset first mapping table records the check values within the specified time range. The check values in the preset first mapping table obtained according to the first email index list may be compared with the corresponding check values in the preset second mapping table obtained according to the second email index list. Because the check value is generated according to the index data of each email, it is unnecessary to check email content, so that content to be checked during comparison can be greatly reduced, thus reducing the time for generating the check value. The check values are only related to the quantity of emails, but have nothing to do with the email size, so that the check values can be generated and compared quickly.

In an optional embodiment, the generating an initial check value corresponding to the any email according to the receiving time corresponding to the any email in the first email index list specifically includes:

when the receiving time corresponding to the any email is earlier than a preset year, generating the initial check value corresponding to the any email according to a particular year of the receiving time corresponding to the any email;

when the receiving time corresponding to the any email is a current day, generating the initial check value corresponding to the any email according to the year, month and day of the receiving time corresponding to the any email;

when the receiving time corresponding to the any email is a current month, calculating the initial check value corresponding to the any email according to $P_1=Y-N+M+D-1$, where Y, M and D are the year, month and day of the receiving time corresponding to the any email respectively, and N is the preset year;

when the receiving time corresponding to the any email is a current year, calculating the initial check value corresponding to the any email according to $P_2=Y-N+M-1$, where Y and M are the year and month of the receiving time corresponding to the any email respectively, and N is the preset year; and when the receiving time corresponding to the any email is later than the preset year, calculating the initial check value corresponding to the any email according to $P_3=Y-N$, where Y is the year of the receiving time corresponding to the any email, and N is the preset year.

In an optional embodiment, the calculating current check values corresponding to the emails within the specified time range according to a current date, and updating the current check values corresponding to the emails within the specified time range into the preset first mapping table specifically includes:

calculating, according to a particular year corresponding to the current date and the preset year, a current check value corresponding to each year from the preset year to the year corresponding to the current date;

calculating, according to the year and month corresponding to the current date and the preset year, a current check value corresponding to each month from the first month of the year corresponding to the current date to the month corresponding to the current date;

calculating, according to the year, month and day corresponding to the current date and the preset year, a current check value corresponding to each day from the first day of the month corresponding to the current date to the day corresponding to the current date; and updating the current check value corresponding to each year, the current check value corresponding to each month, and the current check value corresponding to each day into the preset first mapping table.

In this embodiment, the check value corresponding to each year from the preset year to the year corresponding to the current date is calculated according to $P[y_i]=y_i-N$, where $y_i$, is a particular year corresponding to the $i^{th}$ year, and N is the preset year. The check value corresponding to each month from the first month of the year corresponding to the current date to the month corresponding to the current date is calculated according to $P[y+(a_i-u)]=y-N+m_i-1$, where y is a particular year corresponding to the current date, $m_i$ is a particular month corresponding to the $i^{th}$ month in the year corresponding to the current date, N is the preset year, $a_i$ is an index value corresponding to the $i^{th}$ month, and u is a difference between the year corresponding to the current date and the preset year, minus 1. The check value corresponding to each day from the first day of the month corresponding to the current date to the day corresponding to the current date is calculated according to $P[y+m+(b_i-v)]=y-N+m+d_i-1$, where y and m are the year and month corresponding to the current date respectively, $d_i$ is a particular day corresponding to the $i^{th}$ day in the month corresponding to the current date, N is the preset year, $b_i$ is an index value corresponding to the $i^{th}$ day, and v is a difference between the year corresponding to the current date and the preset year, minus 1. Specifically, the index value $a_i$ corresponding to the $i^{th}$ month is automatically generated according to the principle of sequence number incrementing, and an initial value of $a_i$ is the difference between the year corresponding to the current date and the preset year. The index value $b_i$ corresponding to the $i^{th}$ day is automatically generated according to the principle of sequence number incrementing, and an initial value of $b_i$ is a maximum value of $a_i$ plus 1.

For example, the preset year is the year 2000, and the current date is Sep. 30, 2017. In this case, $17 \leq a_i \leq 25$, and $26 \leq b_i \leq 54$. The check value corresponding to each year from the preset year to the year corresponding to the current date is as follows: $P[2000]=2000-2000=0$, $P[2001]=1$, ... $P[2016]=16$. The check value corresponding to each month from the first month of the year corresponding to the current date to the month corresponding to the current date is as follows: $P[2017+17-16=2018]=2017-2000+1-1=17$, $P[2019]=18$, ... $P[2026]=25$. The check value from the first day of the month corresponding to the current date to the day corresponding to the current data is as follows: $P[2017+9+26-25=2027]=2017-2000+9+1-1=26$, $P[2028]=27$ ... $P[2055]=55$.

In this embodiment, the check values of the emails within the specified time range are compared, so that the email data within the specified time range is synchronized when the check values are inconsistent. For example, if the specified time range is the latest month, email data within the latest month can be synchronized, thereby reducing the total amount of data to be synchronized, implementing synchronization of email data within a small range and ensuring the efficiency and speed of synchronization. Moreover, different time ranges may be set, to set different synchronization policies for user groups of different grades, thus improving user experience. A back-end server may further synchronize historical email data based on time periods As can be learned from the check values calculated above, at an earlier time, statistics are collected based on a longer time range (mainly a year); at a more recent time, statistics are collected based on a shorter time range (mainly a day). Synchronization of emails is correlated with the use of the emails, which conforms to the rule that when it is closer to the current date, user emails change more significantly, and less email data needs to be synchronized if emails corresponding to the specified time range have changes, thus avoiding obtaining a large amount of email data. By comparing check values, when some check values are inconsistent, only email data within a time range corresponding to the inconsistent check values needs to be synchronized, thus reducing the data transmission amount and the number of emails for comparison, and achieving higher synchronization efficiency.

Figure 2:
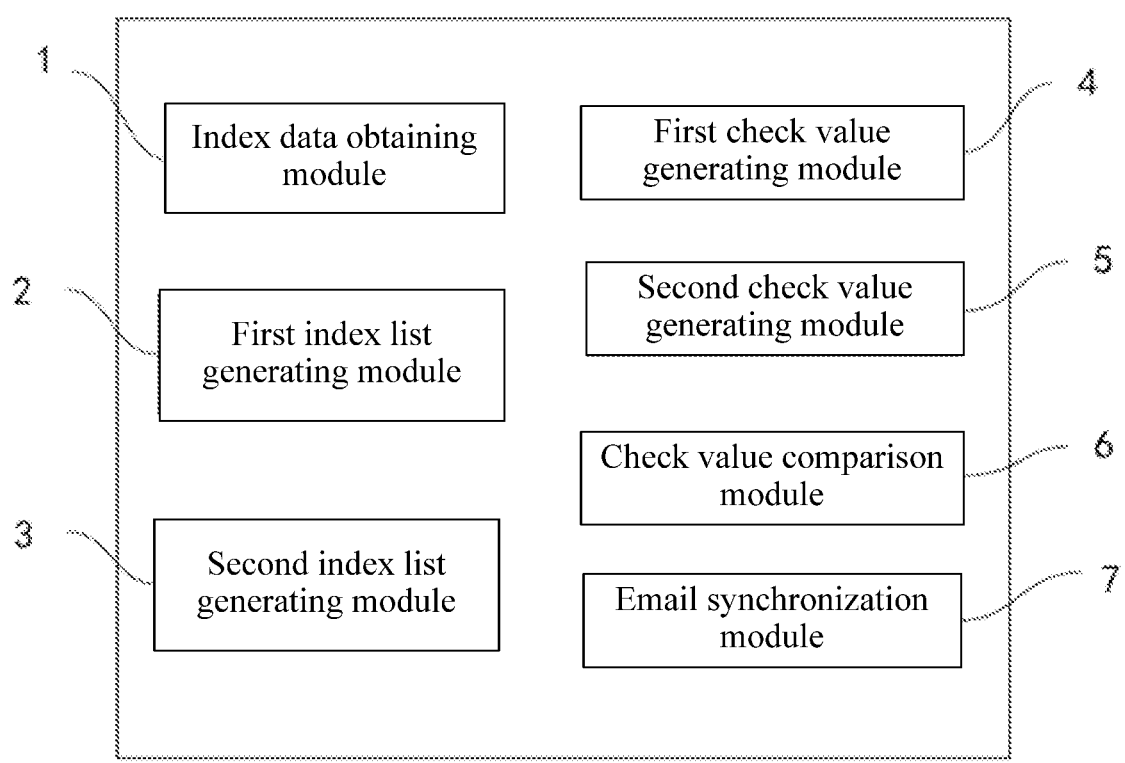
FIG. 2 is a schematic diagram of an email synchronization apparatus according to an embodiment of the present invention.

Referring to FIG. 2, FIG. 2 is a schematic of an email synchronization apparatus according to an embodiment of the present invention. The email synchronization apparatus includes:

an index data obtaining module 1, configured to separately obtain index data of emails of a host node system and a mirror node system within a specified time range, where the index data includes email identifiers, flag bits, folders, and receiving times;

a first index list generating module 2, configured to generate a first email index list according to the index data of the emails of the host node system within the specified time range;

a second index list generating module 3, configured to generate a second email index list according to the index data of the emails of the mirror node system within the specified time range;

a first check value generating module 4, configured to generate check values of the emails of the host node system within the specified time range according to the first email index list;

a second check value generating module 5, configured to generate check values of the emails of the mirror node system within the specified time range according to the second email index list;

a check value comparison module 6, configured to compare the generated check values of the host node system with the generated check values of the mirror node system; and an email synchronization module 7, configured to synchronize email data of the host node system and the mirror node system within the specified time range when the generated check values of the host node system are inconsistent with the generated check values of the mirror node system.

The apparatus directly generates the check values according to the index data. The check values are only related to the quantity of emails, but have nothing to do with the email size, so that the check values can be generated and compared quickly. In addition, it is unnecessary to check email content during comparison, which reduces the comparison time, thereby effectively reducing the time spent on email comparison, improving the synchronization efficiency of email data, and achieving two-way synchronization between the host node system and the mirror node system.

The index data further includes index modification times, senders, recipients, subjects, header Message-IDs, and the like. When the specified time range is null, index data of all emails of the host node system and the mirror node system is obtained separately, and the index data is sorted according to the index modification times. Specifically, the first email index list is generated according to the email identifiers, flag bits, folders and receiving times in the index data of the emails of the host node system within the specified time range; and the second email index list is generated according to the email identifiers, flag bits, folders and receiving times in the index data of the emails of the mirror node system within the specified time range. The first check value generating module and the second check value generating module have exactly the same functional modules and units, and implement exactly the same functions. That is, the functional modules or units of the second check value generating module correspond to those of the first check value generating module in a one-to-one manner. Therefore, the first check value generating module is taken as an example for description.

In an optional embodiment, the email synchronization module includes:

an email data comparison unit, configured to compare email identifiers and flag bits in the first email index list with corresponding email identifiers and flag bits in the second email index list when the generated check values of the host node system are inconsistent with the generated check values of the mirror node system, to obtain a list of property changes of partial indexes, a list of new email identifiers of the host node system, a list of deleted email identifiers of the host node system, and a list of new email identifiers of the mirror node system;

a mirror node system synchronization unit, configured to synchronize the email data of the host node system within the specified time range to the mirror node system according to the list of the property changes of the partial indexes, the list of the new email identifiers of the host node system, and the list of the deleted email identifiers of the host node system; and a host node system synchronization unit, configured to synchronize the email data of the mirror node system within the specified time range to the host node system according to the list of the new email identifiers of the mirror node system.

In an optional embodiment, the mirror node system synchronization unit includes:

a property synchronization unit, configured to synchronize change content of the host node system within the specified time range to the mirror node system according to the list of the property changes of the partial indexes;

a new email synchronization unit, configured to obtain, according to the list of the new email identifiers of the host node system, a list of new emails marked as being in a non-deferred deletion state of the host node system within the specified time range, and synchronize email data in the host node system corresponding to the list of the new emails to the mirror node system; and a deleted email synchronization unit, configured to obtain, according to the list of the deleted email identifiers of the host node system, a list of deleted emails marked as being in a deferred deletion state of the host node system within the specified time range, and delete email data in the mirror node system corresponding to the list of the deleted emails.

In this embodiment, when a user deletes an email, the email deleted by the user is marked as being in a deferred deletion state in the host node system. In this case, it seems to the user that the email has been deleted, while the email is actually deleted later in the background, thus providing a data basis for two-way synchronization between the host node system and the mirror node system.

In an optional embodiment, the host node system synchronization unit includes:

a system email synchronization unit, configured to obtain, according to the list of the new email identifiers of the mirror node system, a list of system emails generated by the mirror node system, and synchronize email data in the mirror node system corresponding to the list of system emails to the host node system.

In this implementation, the check values of the mirror node system within the specified time range are calculated by using the same method as calculating the check values of the host node system within the specified time range, and the check values of the mirror node system within the specified time range are updated into a preset second mapping table. The preset first mapping table records the check values within the specified time range. The check values in the preset first mapping table obtained according to the first email index list may be compared with the corresponding check values in the preset second mapping table obtained according to the second email index list. Because the check value is generated according to the index data of each email, it is unnecessary to check email content, so that content to be checked during comparison can be greatly reduced, thus reducing the time for generating the check value. The check values are only related to the quantity of emails, but have nothing to do with the email size, so that the check values can be generated and compared quickly.

In an optional embodiment, a host-node initial check value generating unit is configured to: when the receiving time corresponding to the any email is earlier than a preset year, generate the initial check value corresponding to the any email according to a particular year of the receiving time corresponding to the any email;

the host-node initial check value generating unit is configured to: when the receiving time corresponding to the any email is a current day, generate the initial check value corresponding to the any email according to the year, month and day of the receiving time corresponding to the any email;

the host-node initial check value generating unit is configured to: when the receiving time corresponding to the any email is a current month, calculate the initial check value corresponding to the any email according to $P_1=Y-N+M+D-1$, where Y, M and D are the year, month and day of the receiving time corresponding to the any email respectively, and N is the preset year;

the host-node initial check value generating unit is configured to: when the receiving time corresponding to the any email is a current year, calculate the initial check value corresponding to the any email according to $P_2=Y-N+M-1$, where Y and M are the year and month of the receiving time corresponding to the any email respectively, and N is the preset year; and the host-node initial check value generating unit is configured to: when the receiving time corresponding to the any email is later than the preset year, calculate the initial check value corresponding to the any email according to $P_3=Y-N$, where Y is the year of the receiving time corresponding to the any email, and N is the preset year.

In an optional embodiment, a host-node second check value generating unit is configured to calculate, according to a particular year corresponding to the current date and the preset year, a current check value corresponding to each year from the preset year to the year corresponding to the current date;

the host-node second check value generating unit is configured to calculate, according to the year and month corresponding to the current date and the preset year, a current check value corresponding to each month from the first month of the year corresponding to the current date to the month corresponding to the current date;

the host-node second check value generating unit is configured to calculate, according to the year, month and day corresponding to the current date and the preset year, a current check value corresponding to each day from the first day of the month corresponding to the current date to the day corresponding to the current date; and the host-node second check value generating unit is configured to update the current check value corresponding to each year, the current check value corresponding to each month, and the current check value corresponding to each day into the preset first mapping table.

In this embodiment, the check value corresponding to each year from the preset year to the year corresponding to the current date is calculated according to $P[y_{id}]=y_i-N$, where $y_i$, is a particular year corresponding to the $i^{th}$ year, and N is the preset year. The check value corresponding to each month from the first month of the year corresponding to the current date to the month corresponding to the current date is calculated according to $P[y+(a_i-u)]=y-N+m_i-1$, where y is a particular year corresponding to the current date, $m_i$ is a particular month corresponding to the $i^{th}$ month in the year corresponding to the current date, N is the preset year, $a_i$ is an index value corresponding to the $i^{th}$ month, and u is a difference between the year corresponding to the current date and the preset year, minus 1. The check value corresponding to each day from the first day of the month corresponding to the current date to the day corresponding to the current date is calculated according to $P[y+m+(b_i-v)]=y-N+m+d_i-1$, where y and m are the year and month corresponding to the current date respectively, $d_i$ is a particular day corresponding to the $i^{th}$ day in the month corresponding to the current date, N is the preset year, $b_i$ is an index value corresponding to the $i^{th}$ day, and v is a difference between the year corresponding to the current date and the preset year, minus 1. Specifically, the index value $a_i$ corresponding to the $i^{th}$ month is automatically generated according to the principle of sequence number incrementing, and an initial value of $a_i$ is the difference between the year corresponding to the current date and the preset year. The index value $b_i$ corresponding to the $i^{th}$ day is automatically generated according to the principle of sequence number incrementing, and an initial value of $b_i$ is a maximum value of $a_i$ plus 1.

For example, the preset year is the year 2000, and the current date is Sep. 30, 2017. In this case, $17 \le a_i \le 25$, and $26 \le b_i \le 54$. The check value corresponding to each year from the preset year to the year corresponding to the current date is as follows: $P[2000]=2000-2000=0$, $P[2001]=1$, ... $P[2016]=16$. The check value corresponding to each month from the first month of the year corresponding to the current date to the month corresponding to the current date is as follows: $P[2017+17-16=2018]=2017-2000+1-1=17$, $P[2019]=18$, ... $P[2026]=25$. The check value from the first day of the month corresponding to the current date to the day corresponding to the current data is as follows: $P[2017+9+26-25=2027]=2017-2000+9+1-1=26$, $P[2028]=27$ ... $P[2055]=55$.

In this embodiment, the check values of the emails within the specified time range are compared, so that the email data within the specified time range is synchronized when the check values are inconsistent. For example, if the specified time range is the latest month, email data within the latest month can be synchronized, thereby reducing the total amount of data to be synchronized, implementing synchronization of email data within a small range and ensuring the efficiency and speed of synchronization. Moreover, different time ranges may be set, to set different synchronization policies for user groups of different grades, thus improving user experience. A back-end server may further synchronize historical email data based on time periods As can be learned from the check values calculated above, at an earlier time, statistics are collected based on a longer time range (mainly a year); at a more recent time, statistics are collected based on a shorter time range (mainly a day). Synchronization of emails is correlated with the use of the emails, which conforms to the rule that when it is closer to the current date, user emails change more significantly, and less email data needs to be synchronized if emails corresponding to the specified time range have changes, thus avoiding obtaining a large amount of email data. By comparing check values, when some check values are inconsistent, only email data within a time range corresponding to the inconsistent check values needs to be synchronized, thus reducing the data transmission amount and the number of emails for comparison, and achieving higher synchronization efficiency.

An embodiment of the present invention further provides an email synchronization apparatus, including a processor, a memory, and a computer program that is stored in the memory and configured to be executed by the processor. When executing the computer program, the processor implements the foregoing email synchronization method.

For example, the computer program may be divided into one or more modules/units. The one or more modules/units are stored in the memory and executed by the processor to complete the present invention. The one or more modules/units may be one or more computer program instruction segments capable of completing specific functions, and the one or more instruction segments are used for describing an execution process of the computer program in the email synchronization apparatus. For example, the computer program may be divided into an index data obtaining module, configured to separately obtain index data of emails of a host node system and a mirror node system within a specified time range, where the index data includes email identifiers, flag bits, folders, and receiving times; a first index list generating module, configured to generate a first email index list according to the index data of the emails of the host node system within the specified time range; a second index list generating module, configured to generate a second email index list according to the index data of the emails of the mirror node system within the specified time range; a first check value generating module, configured to generate check values of the emails of the host node system within the specified time range according to the first email index list; a second check value generating module, configured to generate check values of the emails of the mirror node system within the specified time range according to the second email index list; a check value comparison module, configured to compare the generated check values of the host node system with the generated check values of the mirror node system; and an email synchronization module, configured to synchronize email data of the host node system and the mirror node system within the specified time range when the generated check values of the host node system are inconsistent with the generated check values of the mirror node system.

The email synchronization apparatus may be a computing device such as a desktop computer, a notebook, a palmtop computer, and a cloud server. The email synchronization apparatus may include, but is not limited to, a processor and a memory. A person skilled in the art may understand that the figure merely shows an example of the email synchronization apparatus, and does not limit the email synchronization apparatus. The apparatus may include more or fewer components than those shown in the figure, or some components may be combined, or different components may be used. For example, the email synchronization apparatus may further include an input/output device, a network access device, a bus, or the like.

The processor may be a Central Processing Unit (CPU), and may also be another general-purpose processor, a Digital Signal Processor (DSP), an Application Specific Integrated Circuit (ASIC), a Field-Programmable Gate Array (FPGA) or another programmable logic device, a discrete gate, a transistor logic device, a discrete hardware component, and the like. The general-purpose processor may be a microprocessor, or any conventional processor. The processor is a control center of the email synchronization apparatus, and various parts of the whole email synchronization apparatus are connected by using various interfaces and lines.

The memory may be configured to store the computer program and/or modules. The processor implements various functions of the email synchronization apparatus by running or executing the computer program and/or modules stored in the memory and invoking data stored in the memory. The memory may mainly include a program storage area and a data storage area. The program storage area may store an operating system, an application program required by at least one function (such as a sound playing function and an image playing function), and the like. The data storage area may store data (such as audio data and an address book) created according to use of a mobile phone, and the like. In addition, the memory may include a high-speed random access memory, and may further include a non-volatile memory, such as a hard disk, an internal storage, a plug-in hard disk, a Smart Media Card (SMC), a Secure Digital (SD) card, a Flash Card, at least one magnetic disk storage device, a flash memory device, or other volatile solid-state storage devices.

The module/unit integrated in the email synchronization apparatus, if implemented in the form of a software functional unit and sold or used as a stand-alone product, may be stored in a computer-readable storage medium. Based on such an understanding, all or some of processes for implementing the method in the foregoing embodiments can be completed by instructing relevant hardware through a computer program. The computer program may be stored in a computer readable storage medium. When the computer program is executed by a processor, steps of the foregoing method embodiments may be implemented. The computer program includes computer program code, and the computer program code may be in the form of source code, the form of object code, an executable file or some intermediate forms, and the like. The computer readable medium may include: any physical entity or apparatus capable of carrying the computer program code, a recording medium, a USB disk, a mobile hard disk drive, a magnetic disk, an optical disc, a computer memory, a Read-Only Memory (ROM), a Random Access Memory (RAM), an electrical carrier signal, a telecommunications signal, a software distribution medium, and the like. It should be noted that, the content contained in the computer readable medium may be added or deleted properly according to the legislation and the patent practice in the jurisdiction. For example, in some jurisdictions, depending on the legislation and the patent practice, the computer-readable storage medium may not include the electrical carrier signal or the telecommunications signal.

An embodiment of the present invention further provides a computer readable storage medium, where the computer readable storage medium induces a stored computer program, and when being run, the computer program controls a device where the computer readable storage medium is located to perform the foregoing email synchronization method.

Compared with the prior art, an email synchronization method provided in the embodiments of the present invention achieves the following beneficial effects: The email synchronization method includes: separately obtaining index data of emails of a host node system and a mirror node system within a specified time range, where the index data includes email identifiers, flag bits, folders, and receiving times; generating a first email index list according to the index data of the emails of the host node system within the specified time range; generating a second email index list according to the index data of the emails of the mirror node system within the specified time range; generating check values of the emails of the host node system within the specified time range according to the first email index list; generating check values of the emails of the mirror node system within the specified time range according to the second email index list; comparing the generated check values of the host node system with the generated check values of the mirror node system; and synchronizing email data of the host node system and the mirror node system within the specified time range when the generated check values of the host node system are inconsistent with the generated check values of the mirror node system. This method can effectively reduce an email comparison time, implement email data synchronization within a small range, improve synchronization efficiency of email data, and also achieve two-way synchronization between the host node system and the mirror node system. Embodiments of the present invention further provide an email synchronization apparatus and a computer readable storage medium.

The above descriptions are merely preferred implementations of the present invention. It should be noted that a person of ordinary skill in the art may further make several improvements and modifications without departing from the principle of the present invention, but such improvements and modifications should be deemed as falling within the protection scope of the present invention.

The invention claimed is:

1. An email synchronization method, comprising:
separately obtaining index data of emails of a host node system and a mirror node system within a specified time range, wherein the index data comprises email identifiers, flag bits, folders, and receiving times;
generating a first email index list according to the index data of the emails of the host node system within the specified time range;
generating a second email index list according to the index data of the emails of the mirror node system within the specified time range;
generating check values of the emails of the host node system within the specified time range according to the first email index list;
generating check values of the emails of the mirror node system within the specified time range according to the second email index list;
comparing the generated check values of the host node system with the generated check values of the mirror node system; and
synchronizing email data of the host node system and the mirror node system within the specified time range when the generated check values of the host node system are inconsistent with the generated check values of the mirror node system.

2. The email synchronization method according to claim 1, wherein the synchronizing email data of the host node system and the mirror node system within the specified time range when the generated check values of the host node system are inconsistent with the generated check values of the mirror node system specifically comprises:

comparing corresponding email identifiers and flag bits in the first email index list with email identifiers and flag bits in the second email index list when the generated check values of the host node system are inconsistent with the generated check values of the mirror node system, to obtain a list of property changes of partial indexes, a list of new email identifiers of the host node system, a list of deleted email identifiers of the host node system, and a list of new email identifiers of the mirror node system;

synchronizing the email data of the host node system within the specified time range to the mirror node system according to the list of the property changes of the partial indexes, the list of the new email identifiers of the host node system, and the list of the deleted email identifiers of the host node system; and synchronizing the email data of the mirror node system within the specified time range to the host node system according to the list of the new email identifiers of the mirror node system.

3. The email synchronization method according to claim 2, wherein the synchronizing the email data of the host node system within the specified time range to the mirror node system according to the list of the property changes of the partial indexes, the list of the new email identifiers of the host node system, and the list of the deleted email identifiers of the host node system specifically comprises:

updating change content of the host node system within the specified time range to the mirror node system according to the list of the property changes of the partial indexes;

obtaining, according to the list of the new email identifiers of the host node system, a list of new emails marked as being in a non-deferred deletion state of the host node system within the specified time range, and synchronizing email data in the host node system corresponding to the list of the new emails to the mirror node system; and obtaining, according to the list of the deleted email identifiers of the host node system, a list of deleted emails marked as being in a deferred deletion state of the host node system within the specified time range, and deleting email data in the mirror node system corresponding to the list of the deleted emails.

4. An email synchronization apparatus, comprising a processor, a memory, and a computer program that is stored in the memory and configured to be executed by the processor, wherein when executing the computer program, the processor implements the email synchronization method according to claim 3.

5. A non-transitory computer readable storage medium, wherein the non-transitory computer readable storage medium is not a signal; wherein the non-transitory computer readable storage medium comprises a stored computer program, and when being run, the computer program controls a device where the non-transitory computer readable storage medium is located to perform the email synchronization method according to claim 3.

6. The email synchronization method according to claim 2, wherein the synchronizing the email data of the mirror node system within the specified time range to the host node system according to the list of the new email identifiers of the mirror node system specifically comprises:

obtaining, according to the list of the new email identifiers of the mirror node system, a list of system emails generated by the mirror node system, and synchronizing email data in the mirror node system corresponding to the list of system emails to the host node system.

7. An email synchronization apparatus, comprising a processor, a memory, and a computer program that is stored in the memory and configured to be executed by the processor, wherein when executing the computer program, the processor implements the email synchronization method according to claim 6.

8. A non-transitory computer readable storage medium, wherein the non-transitory computer readable storage medium is not a signal; wherein the non-transitory computer readable storage medium comprises a stored computer program, and when being run, the computer program controls a device where the non-transitory computer readable storage medium is located to perform the email synchronization method according to claim 6.

9. An email synchronization apparatus, comprising a processor, a memory, and a computer program that is stored in the memory and configured to be executed by the processor, wherein when executing the computer program, the processor implements the email synchronization method according to claim 2.

10. A non-transitory computer readable storage medium, wherein the non-transitory computer readable storage medium is not a signal; wherein the non-transitory computer readable storage medium comprises a stored computer program, and when being run, the computer program controls a device where the non-transitory computer readable storage medium is located to perform the email synchronization method according to claim 2.

11. The email synchronization method according to claim 1, wherein the generating check values of the emails of the host node system within the specified time range according to the first email index list specifically comprises:

generating, according to an email identifier, a flag bit and a folder corresponding to any email in the first email index list, a character string corresponding to the any email;

generating a 32-bit Cyclic Redundancy Check (CRC) value according to the character string corresponding to the any email by using a CRC check tool;

generating an initial check value corresponding to the any email according to the receiving time corresponding to the any email in the first email index list;

performing exclusive or processing on the CRC value and the initial check value corresponding to the any email, to obtain a current check value corresponding to the any email, and updating the current check value corresponding to the any email into a preset first mapping table; and calculating current check values corresponding to the emails within the specified time range according to a current date, and updating the current check values corresponding to the emails within the specified time range into the preset first mapping table.

12. The email synchronization method according to claim 11, wherein the generating an initial check value corresponding to the any email according to the receiving time corresponding to the any email in the first email index list specifically comprises:

when the receiving time corresponding to the any email is earlier than a preset year, generating the initial check value corresponding to the any email according to a particular year of the receiving time corresponding to the any email;

when the receiving time corresponding to the any email is a current day, generating the initial check value corresponding to the any email according to year, month and day of the receiving time corresponding to the any email;

when the receiving time corresponding to the any email is a current month, calculating the initial check value corresponding to the any email according to $P1=Y-N+M+D-1$, wherein Y, M and D are the year, month and day of the receiving time corresponding to the any email respectively, and N is the preset year;

when the receiving time corresponding to the any email is a current year, calculating the initial check value corresponding to the any email according to $P2=Y-N+M-1$, wherein Y and M are the year and month of the receiving time corresponding to the any email respectively, and N is the preset year; and when the receiving time corresponding to the any email is later than the preset year, calculating the initial check value corresponding to the any email according to $P3=Y-N$, wherein Y is the year of the receiving time corresponding to the any email, and N is the preset year.

13. An email synchronization apparatus, comprising a processor, a memory, and a computer program that is stored in the memory and configured to be executed by the processor, wherein when executing the computer program, the processor implements the email synchronization method according to claim 12.

14. The email synchronization method according to claim 11, wherein the calculating current check values corresponding to the emails within the specified time range according to a current date, and updating the current check values corresponding to the emails within the specified time range into the preset first mapping table specifically comprises:

calculating, according to a particular year corresponding to the current date and the preset year, a current check value corresponding to each year from the preset year to the year corresponding to the current date;

calculating, according to the year and month corresponding to the current date and the preset year, a current check value corresponding to each month from the first month of the year corresponding to the current date to the month corresponding to the current date;

calculating, according to the year, month and day corresponding to the current date and the preset year, a current check value corresponding to each day from the first day of the month corresponding to the current date to the day corresponding to the current date; and updating the current check value corresponding to each year, the current check value corresponding to each month, and the current check value corresponding to each day into the preset first mapping table.

15. An email synchronization apparatus, comprising a processor, a memory, and a computer program that is stored in the memory and configured to be executed by the processor, wherein when executing the computer program, the processor implements the email synchronization method according to claim 14.

16. An email synchronization apparatus, comprising a processor, a memory, and a computer program that is stored in the memory and configured to be executed by the processor, wherein when executing the computer program, the processor implements the email synchronization method according to claim 11.

17. A non-transitory computer readable storage medium, wherein the non-transitory computer readable storage medium is not a signal; wherein the non-transitory computer readable storage medium comprises a stored computer program, and when being run, the computer program controls a device where the non-transitory computer readable storage medium is located to perform the email synchronization method according to claim 11.

18. An email synchronization apparatus, comprising a processor, a memory, and a computer program that is stored in the memory and configured to be executed by the processor, wherein when executing the computer program, the processor implements the email synchronization method according to claim 1.

19. A non-transitory computer readable storage medium, wherein the non-transitory computer readable storage medium is not a signal; wherein the non-transitory computer readable storage medium comprises a stored computer program, and when being run, the computer program controls a device where the non-transitory computer readable storage medium is located to perform the email synchronization method according to claim 1.

\* \* \* \* \*